United States Patent [19]

Haas et al.

[11] 4,042,454
[45] Aug. 16, 1977

[54] METHOD OF PRODUCING HOMOGENEOUSLY DOPED n-TYPE Si MONOCRYSTALS BY THERMAL NEUTRON RADIATION

[75] Inventors: Ernst Haas; Joachim Martin, both of Erlangen; Konrad Reuschel, Vaterstetten; Manfred Schnöeller, Haimhausen, all of Germany

[73] Assignee: Siemens Aktiengesellschaft, Berlin & Munich, Germany

[21] Appl. No.: 521,388

[22] Filed: Nov. 6, 1974

[30] Foreign Application Priority Data

Nov. 12, 1973 Germany .............................. 2356376

[51] Int. Cl.² .............................................. G21G 1/06
[52] U.S. Cl. ...................................... 176/10; 176/12; 148/1.5
[58] Field of Search ................... 176/10, 12; 156/620, 156/605; 148/1.5

[56] References Cited

U.S. PATENT DOCUMENTS

| 3,076,732 | 2/1963 | Tanenbaum | 148/1.5 |
| 3,134,700 | 5/1964 | Sporrer | 156/620 |
| 3,175,891 | 3/1965 | Keller et al. | 156/620 |
| 3,255,050 | 6/1966 | Klahr | 148/1.5 |
| 3,366,462 | 1/1968 | Kersting et al. | 156/620 |
| 3,705,789 | 12/1972 | Keller | 156/620 |
| 3,734,695 | 5/1973 | Campbell | 156/620 |

OTHER PUBLICATIONS

Soviet Physics–Semiconductors, vol. 4, No. 10, Apr. 71, pp. 1610–1615.
Nucleonics, Apr. 1964, vol. 22, No. 4, pp. 62–65.

*Primary Examiner*—Harvey E. Behrend
*Attorney, Agent, or Firm*—Hill, Gross, Simpson, Van Santen, Steadman, Chiara & Simpson

[57] ABSTRACT

Si monocrystals of the n-type are produced by zone melting polycrystalline Si rods under conditions sufficient to produce monocrystal rods, measuring the specific conductivity of such monocrystal rods and subjecting such monocrystal rods to a controlled radiation by thermal neutrons based on the measured conductivity to produce a desired degree of n-conductivity in the ultimately attained rods.

1 Claim, 1 Drawing Figure

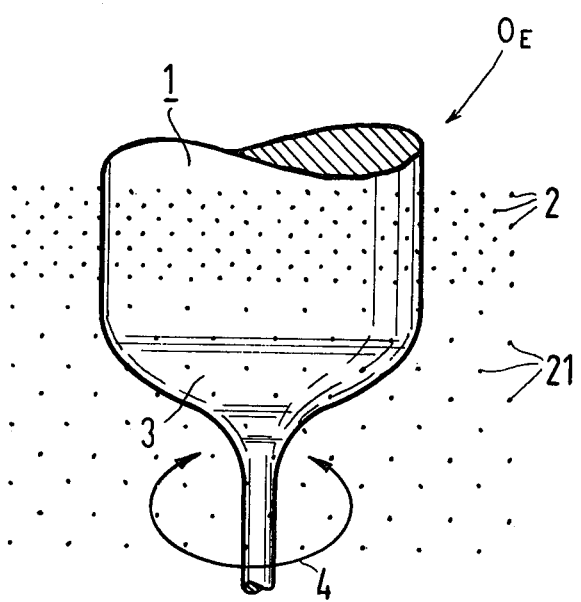

METHOD OF PRODUCING HOMOGENEOUSLY DOPED N-TYPE SI MONOCRYSTALS BY THERMAL NEUTRON RADIATION

BACKGROUND OF THE INVENTION

1. Field of the Invention

The invention relates to a method of producing homogeneously doped n-type Si monocrystals and somewhat more particularly to a method of producing homogeneously doped n-type Si monocrystals having a specific resistivity greater than about 30 ohm × cm by thermal neutron radiation.

2. Prior Art

Si crystal bodies, such as rods, are generally doped after the precipitation or deposition of solid Si onto a heated mandrel or rod-shaped carrier member with the aid of thermal and/or pyrolytic decomposition of gaseous Si compounds. In such a process, dopants are intermixed with a gaseous Si compound and decompose at the carrier member so as to be dispersed within the forming Si body. The Si rods or bodies so produced are polycrystalline and must be converted into a monocrystalline state by subsequent zone melting processes. During such zone melting, the concentration of the dopant within the Si rod often changes in an uncontrollable manner and considerably higher dopant concentrations must be provided in the polycrystalline rods in order to attain a desired dopant concentration in the final monocrystalline rods, especially in instances where a plurality of zone melting processes are utilized. However, such processes are time-consuming and inexact. Further, the devices available for carrying out such processes are only marginally satisfactory and are extremely expensive.

Other methods of producing doped Si crystal bodies are also known, for example, from German Offenlegungsschrift Nos. 1,544,276 and 2,020,182. These prior art references suggest that select dopants be converted to a gaseous state and fed, with the aid of a carrier gas flux, to a molten Si material positioned within an evacuated reaction chamber so that the gaseous dopant is directly blown or carried, for example, into the molten zone of a Si rod undergoing crucible-free zone melt processing. Boron and/or phosphorous compounds which are easily handleable and easily vaporized are generally the dopants utilized with this method. The dosage or concentration of dopants supplied to the molten Si is regulated via valves. However, a great drawback to such methods is that the valves used to control the dopant dosage do not operate in the necessarily exact manner to provide reproducible results. In addition, these methods provide a more or less non-homogeneous distribution of dopants within the finished rod after zone melting. The semiconductor components produced from such inexactly doped Si rods cannot obtain their optimum characteristic properties since the fluctuation of dopants during the growth process of the monocrystalline rods becomes noticeable during the zone melting processes by forming facets and uneven temperature distributions in the melt; in other words, the fluctuations of dopant cause noticeable radial and axial inhomogeneities in the specific resistivity of such a rod; for example, during the occurrence of "striations" which are inhomogeneities of material concentration, fluctuations occur nearly periodically in the crystal.

M. Tanenbaum et al., "Preparation of Uniform Resistivity n-Type Silicon by Nuclear Transmutation", 108 Journal of Electrochemical Society, No. 2, pages 171-176 (February 1961) suggests that Si crystals having n-type conductivity may be produced by radiation of thermal neutrons on pure Si crystals. In this process, the natural isotope $Si^{30}$, which is present in pure Si crystals is transmuted into the unstable isotope $Si^{31}$ by the capture of a thermal neutron and emission of $\gamma$ radiation. The unstable $Si^{31}$ isotope decays by $\beta^-$ emission with a 2.62 hr. half-life into the stable $P^{31}$ isotope. However, pure starting crystals which are required for this process are costly.

SUMMARY OF THE INVENTION

The invention provides a method of homogeneously doping Si monocrystals so that an n-type conductivity (having a specific resistivity $> 30 \Omega$ cm) is achieved by causing a nuclear reaction within the Si crystals by radiating thermal neutrons thereon in accordance with the reaction:

$$Si^{30} (n, \gamma) Si^{31} \xrightarrow{\beta-} P^{31}.$$ 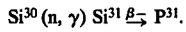

The invention allows the production of a homogeneous striation-free doping over an entire length and cross-section of a Si crystal body in a simple, rational and reproducible manner independent of body diameter. The invention produces n-type Si bodies having a resistance greater than 30 ohm × cm with an exact and homogeneous dopant distribution therein. Heretofore available prior art methods are practically useless in achieving narrow radial and axial resistivity tolerances in n-type Si bodies. The prior art methods are particularly useless in providing tolerance ranges narrower than ±5% for resistivity ($\rho$) values of 90 through 180 ohm × cm.

In accordance with the principles of the invention, polycrystalline Si rods are first freed from any donor material therein by crucible-free zone melting in a vacuum or a protective gas environment and then converted or transformed into a monocrystalline state by prior art methods. Thereafter, the specific electrical resistivity of the rods, which are highly ohmic and n- or p-conductive, is measured and the rods are then subjected to a controlled (time, intensity and target area) radiation of thermal neutrons in accordance with the measured conductivity so that the desired n-conductivity is produced in such rods.

BRIEF DESCRIPTION OF THE DRAWING

The single FIGURE is a partial somewhat schematic view of a Si rod undergoing treatment in accordance with the principles of the invention.

DESCRIPTION OF THE PREFERRED EMBODIMENTS

The invention provides a method of producing homogeneous, striation-free doping of a Si body over its entire length and cross-section in a simple, rational (i.e. pre-calculable) and reproducible matter independent of the body diameter. By following the principles of the invention, it is practical to produce uniformly resistive n-type Si bodies having a resistivity greater than 30 ohm × cm and having an exact and homogeneous dopant distribution therein.

The invention is based on the recognition that pure Si crystals may be rendered n-conductive by radiation thereof with thermal neutrons and provides for homogeneously distributing dopants and Si in such a manner that polycrystalline Si rods or bodies are freed from any donor material present therein by way of crucible-free zone melting in a suitable environment, such as in a vacuum or in a protective gas, and that the resultant polycrystalline rods are then transformed in a known manner to the monocrystalline state. The specific electrical resistivity of such monocrystalline rods, which at this stage is highly ohmic and may be n- or p-conductive, is then measured and the monocrystalline rods are then subjected to controlled radiation by thermal neutrons under time, intensity and location or target area parameters such that the desired n-conductivity is produced in the monocrystalline Si bodies.

With a so-called radiogeneous doping of silicon in accordance with the nuclear reaction:

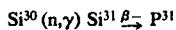

the following simple computation is valid, presuming that the entire amount of $Si^{31}$ is completely decayed and that the transmutation of $Si^{30}$ is negligibly small:

$$N_p = 1.7 \times 10^{-4} \times \phi \times t$$

wherein $N_p$ is the phosphorous concentration in atoms/cm$^3$; $\phi$ is the thermal neutron flow in neutrons/cm$^2 \times$ sec.; and $t$ is the radiation time in seconds.

The invention includes the use of seed or nucleation crystals having a (111)-, (100)- or a (115)-orientation in transforming polycrystalline Si bodies into monocrystalline bodies. The use of such seed crystals facilitates the production of dislocation-free silicon by an additional zone-melting process prior to submitting the Si bodies to neutron radiation, even in the case of fairly large diameter rods.

The invention also includes the rotation of the Si rods about the longitudinal axis thereof. Further, the invention includes subdividing the attained monocrystalline Si bodies into relatively smaller bodies, i.e. disks, before subjecting such disks to radiation by thermal neutrons.

The production of a thermal neutron flow is known in the art and suitable core reactors of the light water moderated type or the graphite moderated type may be utilized as a radiation source.

The single FIGURE schematically illustrates a zone melted dislocation-free (111)-oriented Si rod 1 undergoing radiation by thermal neutrons in a suitable operational environment $O_E$. The neutron field or flux is schematically illustrated by the dots. (The behavior of thermal neutrons is considered analogous to a gas which fills the interior space of a Moderator.) As indicated on the drawing, the radiation target area, location or position is selected such that a lesser concentration of neutrons is present on a select portion of the body than on other areas of the body. In the embodiment shown, the concentration of neutrons is less in the area of the seed crystal 3 than on the remaining portions of the rod. The dots 2 show the greater concentration of thermal neutrons (and thus a greater extent of doping) while the dots 21 show a lesser concentration of thermal neutrons on the seed crystal 3. The curved double-headed arrow 4 schematically indicates the rotation of rod 1 about its longitudinal axis during the radiation step.

With the foregoing general discussion in mind, an exemplary detailed embodiment is presented which will illustrate to those skilled in the art the manner in which the invention may be carried out. However, this embodiment is not intended and should not be construed as limiting the scope of the invention in any manner whatsoever.

A polycrystalline Si rod having a rod length of 900 mm and a diameter of 35 mm is procured for use as a starting material. The specific resistivity of such polycrystalline rod is measured with the aid of a high frequency and comprises 550 ohm $\times$ cm, n-type. This rod is then subjected to a zone melt process in a vacuum environment and thereafter or simultaneously therewith, a seed crystal having a (111)-orientation is connected (by melting and solidification of adjacent surfaces) to the rod. This zone melting process transforms the rod into a zone melted monocrystalline rod which upon measurement has a specific resistivity of 1230 ohm $\times$ cm, n-type.

After two further zone melting processes in a vacuum environment, the rod exhibits a specific resistivity of 2300 ohm $\times$ cm, p-type. Thereafter, the rod is subjected to a further zone melting process in a protective gas environment, such as argon, in order to convert the rod into a dislocation-free Si monocrystalline rod. During this further zone melting, the original rod diameter of 35 mm is changed to 55 mm by a known process, however, if desired, the original rod diameter may be maintained. This Si rod has a specific resistivity of a p-conduction type, which at the seed crystal end is 2500 ohm $\times$ cm and decreases to 2050 ohm $\times$ cm at the opposite end thereof.

On the basis of the resistivity analysis, it is determined that the element boron is the prevalent p-impurity in the crystal. The concentration of boron corresponds to an amount in the range of about $4.6 \times 10^{12}$ to about $6.6 \times 10^{12}$ atoms of boron/cm$^3$ of silicon.

The desired n-doping in the Si monocrystalline rod is 130 ohm $\times$ cm, which corresponds to about $4 \times 10^{13}$ atoms of phosphorous/cm$^3$ of silicon. The neutron flow intensity in the reactor into which the rod is introduced is adjusted to $8 \times 10^{13}$ neutron/cm$^2 \times$ sec.[1] and the rod is subjected to this neutron flow for about 1 hour. A homogeneous doping, free of striations over the entire rod length is attained when the neutron flux is controlled in such a manner that the neutron concentration is about 5% lower in the area of the seed crystal of the monocrystalline body than in other areas of such body. In other words, the embodiment shown, the neutron flux is approximately 5% greater in the area of the original monocrystalline body (which showed up to $6.6 \times 10^{12}$ atoms of boron/cm$^3$ of silicon) than in the area of the seed crystal.

The shape of the monocrystalline Si body being subjected to nuclear radiation is not critical and Si crystal disks, wafers, rods, etc. may be doped in accordance with the principles of the invention.

The invention also includes heat-tempering the doped Si bodies after the neutron radiation step so as to eliminate any possible crystal lattice damage which may have occurred. Preferably, such heat-tempering takes place for about 1 hour in a silicon tube or furnace heated to temperatures above 1000° C. However, this tempering process may be omitted if desired, particularly when the doped Si monocrystalline bodies are further processed or worked into semiconductor components and high-temperature conditions are involved in such further processing.

When a silicon body having a specific resistivity of 15,000 to 18,000 ohm $\times$ cm, n-type is procured as a starting material, a specific resistivity of 120 ohm × cm target value may be obtained by the practice of the invention whereby 4.2 × 10$^{13}$ atoms of phosphorous/cm$^3$ are produced therein by way of neutron transmutation. Thereby, the specific resistivity ($\rho$) fluctuation in the initial or starting body (about 30%) is decreased to approximately 0.3% in the final body.

The invention thus provides for the first time a method of producing Si monocrystalline bodies having a relatively large diameter (greater than 30 mm) which are dislocation-free and without striations and having a homogeneous phosphorous doping therein so that resistivity ($\rho$) fluctuations in axial and radial directions are less than about ±3%. Such doped Si monocrystalline bodies have a wide field of use and are particularly useful in the production of power rectifiers and thyristors operable with high currents and blockage voltages (for example, larger than 5000 V) while exhibiting an excellent avalanche behavior. The method of the invention is also advantageously used for the production of multidiodes (vidicons).

It is thought that the invention and its advantages will be understood from the foregoing description and it is apparent that various changes may be made in the process, form, construction and arrangements of the parts without departing from the scope of the invention or sacrificing its material advantages, the forms hereinbefore described and illustrated in the drawing being merely preferred embodiments.

We claim as our invention:

1. A method of producing a homogeneously n-doped Si rod having a specific resistivity greater than 30 ohm × cm wherein a Si rod is subjected to radiation by thermal neutrons and a nuclear reaction occurs within such rod in accordance with:

$$\text{Si}^{30}(n, \gamma) \text{Si}^{31} \xrightarrow{\beta^-} \text{P}^{31}$$

comprising:
  subjecting a polycrystalline Si rod having a specific resistivity of 550 ohm × cm, n-type to at least one crucible-free zone melting process in a suitably protective environment so as to free said rod of any donor material present therein;
  converting the so-attained polycrystalline rod into a monocrystalline state in a conventional manner;
  measuring the specific resistivity of the so-produced monocrystalline rod; and
  subjecting said monocrystalline rod to controlled radiation by thermal neutrons in accordance with the measured resistivity, the intensity of such controlled radiation comprising 8 × 10$^{13}$ neutrons/cm$^2$ × sec. and the radiation duration comprising about one hour whereby an n-doped Si rod having a concentration of about 4 × 10$^{13}$ atoms of phosphorous/cm$^3$ of silicon therein is produced.

* * * * *